Figure 3A:
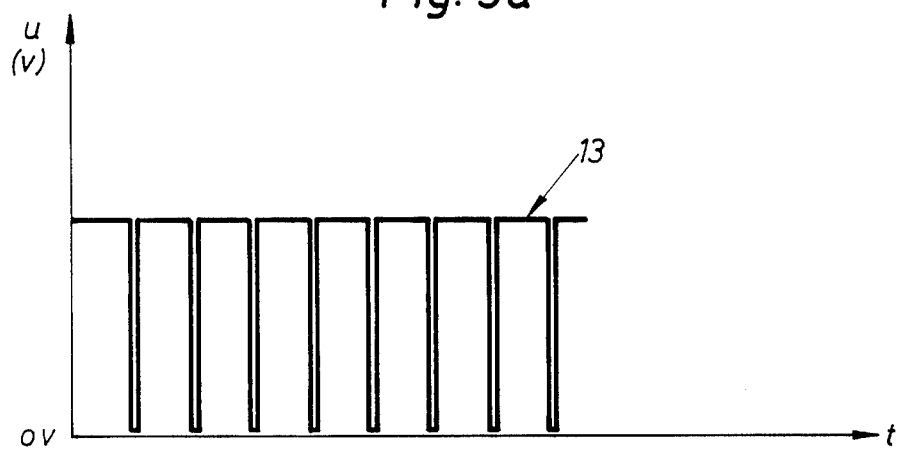

United States Patent [19]

Norrgren et al.

[11] Patent Number: 4,713,545

[45] Date of Patent: Dec. 15, 1987

[54] DEVICE FOR DETECTING OBJECTS, PARTICULARLY SUCH IN MOTION

[75] Inventors: Bo Norrgren, Akarp; Nils Bjelk, Landskrona, both of Sweden

[73] Assignee: Besam AB, Landskrona, Sweden

[21] Appl. No.: 830,395

[22] Filed: Feb. 18, 1986

[30] Foreign Application Priority Data

Feb. 22, 1985 [SE] Sweden .................................. 8500891

[51] Int. Cl.⁴ ............................................. G01J 1/44
[52] U.S. Cl. ..................................... 250/338; 250/221; 250/341; 49/25
[58] Field of Search ................... 250/341, 221, 338 R, 250/351; 49/25; 340/554, 555, 556, 557

[56] References Cited

U.S. PATENT DOCUMENTS 4,068,222 1/1978 Treviranus ........................... 250/221
4,541,080 9/1985 Kodaira ................................. 340/554

*Primary Examiner*—Carolyn E. Fields
*Attorney, Agent, or Firm*—Jordan and Hamburg

[57] ABSTRACT

The invention comprises a pulse transmitter (2,3) for infrared light, the reflected radiation from which is received by photo-diodes (5) converting the light pulses to electric pulses (FIG. 3), which are amplified (9) and applied to a balancing circuit (12), which operates digitally and with a given working or threshold level. Applied pulses give the output of the balancing circuit (12) a low state, which is supplied to a first integration circuit (16) having relatively rapid integration time, and which is in series with a second integration circuit (18). The integration circuits each control an input (21,26) of a comparison circuit (22), which generates an operation signal on its output (27,28) when there is a difference in integration conditions, the slower integration circuit (18) controlling the working or threshold level of the balancing circuit (12).

6 Claims, 8 Drawing Figures

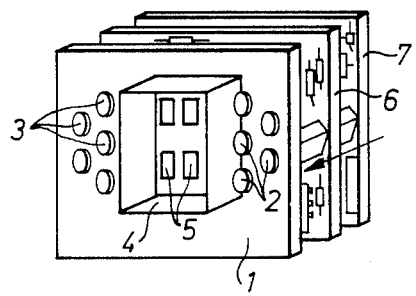
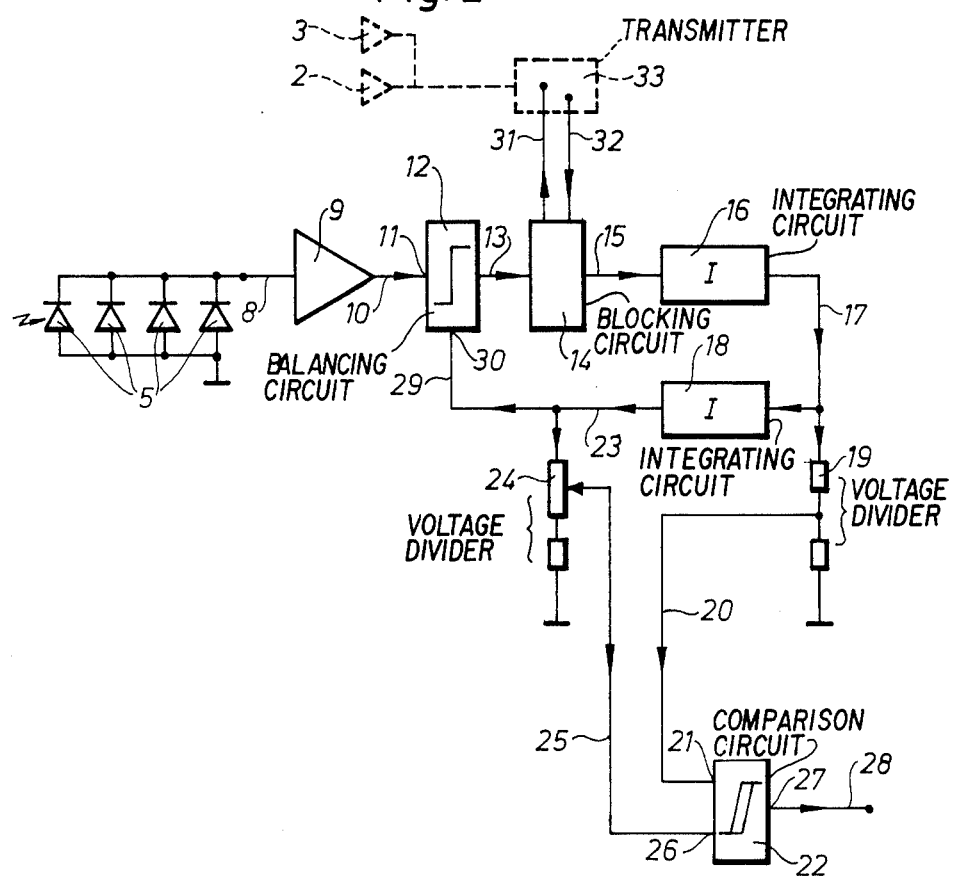

DEVICE FOR DETECTING OBJECTS, PARTICULARLY SUCH IN MOTION

In co-action with automatic door openers there are always arranged transducers for the purpose of detecting and also generating operation signals when a person or an object passes or approaches the area around the door. A common form of transducer at present is a so called doppler radar transducer, which may be operated univocally for triggering operation when a person or object moves towards the transducer. A certain hesitation concerning the use of doppler radar transducers has risen in recent times with regard to as yet not entirely investigated radiation risks within the relatively high-frequency bands in question here. Photoelectric sensing, e.g. with infra red light (IR), is therefore to be preferred. However, it is extremely difficult in conventional installations optically to detect movement towards such as a door with liability without arranging series of light paths to be interrupted by the person passing. It would therefore be desirable to provide a device which operates in an equivalent manner to a doppler radar transducer, and which could be implemented as a similar unit to be located in the vicinity of e.g. a door co-acting with the device, which could then monitor the entry and/or exit area by the use of such as IR light.

The present invention relates to a proposal solving the above mentioned problems. The inventive subject includes a device for detecting objects, particularly such in motion, and includes optical radiation source, preferably pulsed, which emits light within the IR range, for example, and a receiver for radiation which includes integration circuits with different integration times, the receiver also including means for comparison of the respective states of the integration circuits and that these means send an operating signal as long as there is a difference in state. The invention is essentially characterized in that the integration circuits are series-connected, the circuit having the shortest integration time being adapted for having applied to it the received signal states. The receiver is suitably settable to a working or threshold value, which is applied to a balancing circuit before feeding to the integration circuits. The threshold value is suitably derived from the operation level of the so called background integrator. The integrators thus operate at different rates and with an urge substantially to adjust themselves to an applied state. As long as both integration circuits have substantially different conditions the comparison circuit generates an operation condition or an output signal.

The characterizing features of the invention are disclosed in the following claims.

The invention will now be described in detail with reference to an embodiment depicted on the accompanying drawings, where FIG. 1 illustrates a practical configuration of a device in accordance with the invention seen in perspective;

FIG. 2 is a block diagram of the receiver in the device;

FIGS. 3a,b,c,d show graphs of voltages occurring in the receiver; and

Figure 4A:
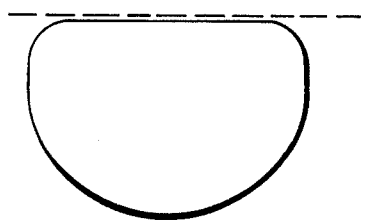

FIGS. 4a and b illustrate different types of monitoring area diagram that an inventive device can be envisaged as covering.

The device illustrated in FIG. 1 comprises a front plate 1, on the front of which there are arranged two groups 2 and 3 of light emitting diodes (LED's). Each group includes five LED's, suitably of the kind emitting IR light. Four photo-diodes 5 are arranged in an area defined by a rectangular screen 4 on the front plate 1. Two circuit boards 6,7 are attached to the back of the front plate and carry transmitter and receiver electronics.

Enclosing the front plate and the circuit borads 6,7 there is a casing, not shown. The entire device is thus to be regarded as a transducer unit of the kind mentioned above.

The unit includes a transmitter connected to the LED's 2 and 3 and it is assumed to transmit pulses so that the IR light emitted will be pulsed. The light is emitted from the LED's without any particular lens system, although such may be envisaged in particular applications. The screen 4 has the task of preventing direct radiation from the LED's becoming incident on the photo-diodes, and it also defines the desired detection characteristic. The front of the unit is suitably provided with a cover glass which is transparent to IR light.

Pulsed IR light is thus emitted from the LED's towards the area to be monitored. Light from some person or object within the area is then reflected, to become incident on the photo-diodes 5, which convert the light pulses to electric pulses, these being received and processed in the receiver.

The block diagram illustrated in FIG. 2 has the photodiodes 5 drawn in. These are connected via a line 8 to an amplifier 9, the output of which feeds via line 10 one input 11 of a balancing circuit 12, which has its output connected via a line 13 to a controllable blocking circuit 14. The latter circuit is connected via a line 15 to a first integration circuit 16, the output of which feeds via a line 17 a second integration circuit 18. The first integration circuit 16 is connected via the line 17 to a voltage divider 19 also, and from the latter voltage is taken via a line 20 to one input 21 of a comparison circuit 22. The second integrator 18 has its output connected via line 23 to an adjustable voltage divider 24, which is connected to the second input 26 of the comparator circuit 22 via a line 25. An operation line 28 is applied to the output 27 of the comparison circuit 22, and may be connected to an unillustrated operation circuit for a door opening mechanism. The line 23 departing from the integration circuit 18 branches into a further line 29 which is connected to the second input 30 of the balancing circuit 12. Two control lines 31 and 32 are connected to the controllable blocking circuit 14, and these two lines are connected to a transmitter 33 sending appropriate light pulses and indicated by dashed lines.

The device described above functions in the following manner:

It is assumed that pulses are given by the transmitter 33 for sending pulsed IR radiation from the LED.s 2,3. The transmitter period time is about 500 $\mu s$, during which the LED's are energised for about 40 $\mu s$. The detailed embodiment of the transmitter does not need to be described in detail since it can be made in accordance with the prior art. The light pulses are reflected from an object within the monitoring area and are received by the photo-diodes. The electric signals thus obtained are transmitted via the line 8 to the amplifier 9, which in turn feeds one input 11 of the balancing circuit 12 via the line 10. The output of the balancing circuit 12 is adapted such that it either assumes a high or a low digital level in response to the input signal conditions. It also operates at a given operation or threshold level, which is controlled by the input signal level on the second input 30 of the balancing circuit 12. The amplifier 9 is implemented such that on reception of pulses it has at its output negative pulses in relation to a prevailing central level, and in this connection FIGS. 3a-3d are referred to.

With regard to the reception of the pulses in question it is assumed that the output of the balancing circuit 12 goes low. The duration of this state is dependent on the duration of the incoming pulses. As soon as a pulse ceases the output of the balancing circuit goes high.

These states are fed to the blocking circuit 14 via the line 13. The circuit 14 is synchronized with the transmitter 33 via the line 32 such that this circuit is only open during the interval transmission occurs, i.e. during the previously mentioned 40 µs. During any other time the circuit 14 blocks transmission of a signal state to following circuits. By this arrangement it is ensured that the receiver is only sensitive to the transmission of its own transmitter and not to other similar transducers mounted in the vicinity. A so called frequency shift signal is introduced into the system as a further safety signal.

The central line 31 between the controllable blocking circuit 14 and the transmitter 33 functions such that if, during a reception interval (as already mentioned 40 µs), a signal from an adjacent transmitter coming from another door opening unit or the like were to arrive, the frequency shift circuit operates such that the local transmitter 33 will alter its frequency somewhat, so that it differs from the frequency of the disturbing transmitter. The receiver will of course receive an altered frequency, but this has no significance with regard to there still being synchronization between the transmitter 33 and the blocking circuit 14 via the line 32. As soon as noise signals cease, the local transmitter 33 returns once again to the originally set frequency. By this arrangement there is ensured that the installation functions even if pulses from another transmitter are accidentally received.

Let it now be assumed that the blocking circuit 14 is open and transfers states via the line 15 to the integration circuit 16. This circuit is such that in relation to the integration circuit 18 it rapidly adjusts itself to applied conditions, whereas the circuit 18 has a longer integration time. In the present connection the circuit 16 is designated "impulse integrator" while the integrator 18 is designated "background integrator". As will be seen from FIG. 2 both integrators are series connected via the line 17. The impulse integrator 16 serves to rectify incoming states, i.e. pulses, a mean value of supplied pulse energy being created in response to the pulse length, i.e. the energising time of each individual pulse. Consequently, a DC level outputs from the impulse integrator 16 and is applied to the background integrator 18 and the input 21 of the comparison circuit 22. In this connection it may be mentioned that both integrators may operate in parallel, i.e. that the background integrator 18 is also controlled by incoming pulses, e.g. by connecting its input to the line 15. The advantage with the illustrated arrangement is, however, that there is thus obtained better fidelity for variations of the surrounding temperature. The levels coming from the outputs of the integrators will be reflected in the voltages in the lines 20 and 25. This means that as soon as the integrators 16 and 18 are in operation different states or levels arise on the inputs 21 and 26 of the comparison circuit 22, resulting in that an operation signal or state is sent from the comparison circuit to the operation line 28. This condition remains as long as there is a certain difference between the levels on the lines 20 and 25. As mentioned above, there is a connection line 29 between the output line 23 of the background integrator 18 and the second input 30 of the balancing circuit 12. This connection serves the purpose of permitting the integrated level in the background integrator 18 to form an operation level for the balancing circuit 12.

If a person or an object which has come into the monitoring area stops and stands still, a given signal level reaches to the photo-diodes 5 and in this case it will be constant. Consequently there is no variation in the signal level, which means that the background integrator 18 gradually assumes the same level as the impulse integrator 16, which in turn means that the levels on both inputs 21 and 26 of the comparison circuit 22 will be the same. However, the level of the background integrator is adjusted by the voltage divider 24 such that it obtains a somewhat lower level than the impulse integrator, which results in that no operation signal will come on the line 28, i.e. the door will not open in this case. On the other hand, as soon as the person or object once again moves closer and the signal strength increases, the above mentioned sequence is repeated, resulting in an operation signal on the line 28. By this arrangement there has thus been achieved a transducer which is sensitive to movement but insensitive to stationary objects, i.e. function has been achieved which is equivalent to the one which may be obtained with a so called Doppler radar transducer. It is important that a somewhat lower level is always present on the input 26 of the comparison circuit 22 than on the input 21 so that the door will not be opened unintentionally. As already stated, the situation is that a signal on the output 28 is only obtained if the level on the input 21 is lower than the level on the input 26.

Figure 3B:
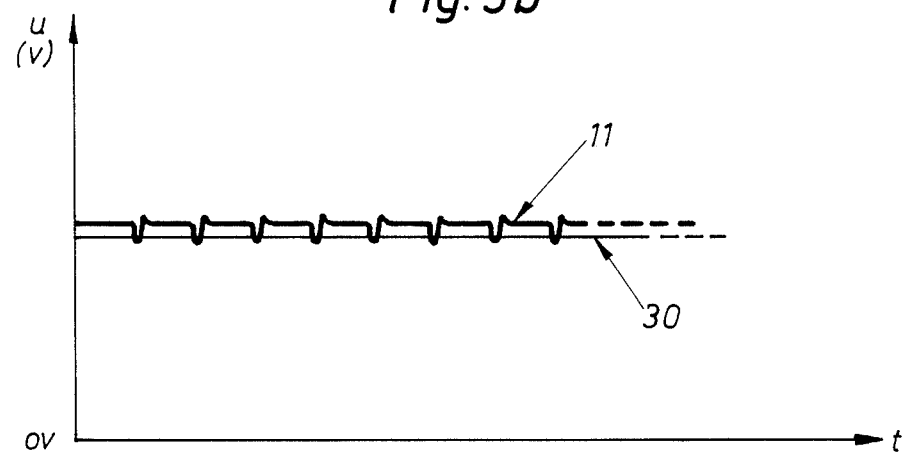
Figure 3C:
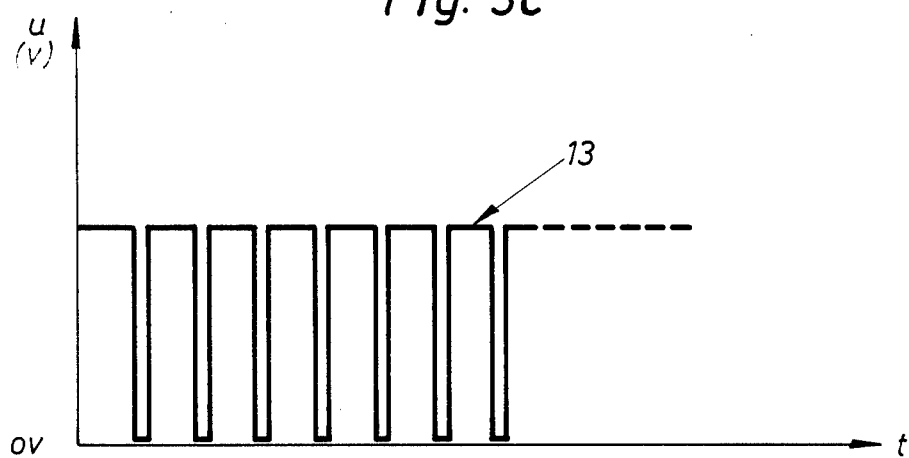
Figure 3D:
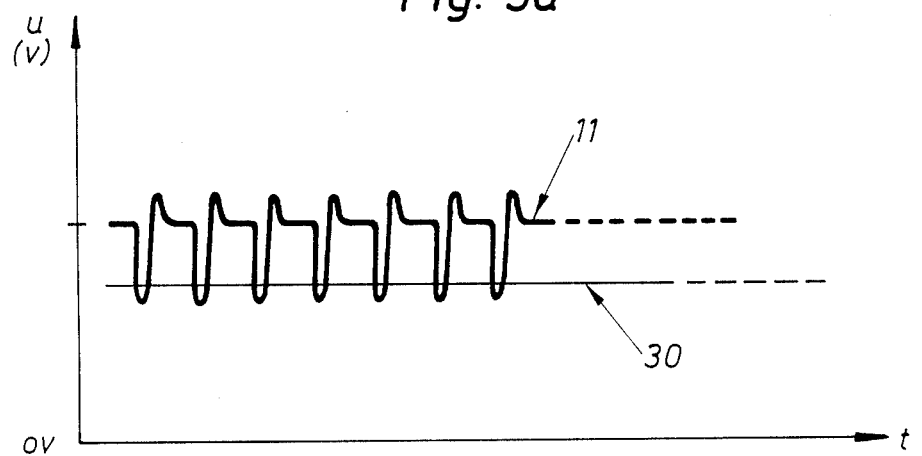

It will be seen from FIGS. 3a and 3b that in an inoperational state, i.e. when there is no object moving within the operational field of the receiver, there is obtained a condition on the output 13 of the balancing circuit 12 which is depicted in FIG. 3a. A given pulse spectrum is always obtained due to reflection pulses from the surroundings reaching the receiver. The received pulses on the input 11 are illustrated in FIG. 3b in relation to the working level or threshold level generated by the background integrator 18 at the input 30 of the circuit 12. As will be seen from FIGS. 3c and 3d, when an object or person has come relatively far into the detection area of the installation, there occurs relatively long states or wide pulses on the output of the balancing circuit 12, i.e. the line 13, as a result of an increased input signal. Resulting from the operation of the integrators there is obtained a threshold or working level via the input 30 which is displaced in a negative direction with respect to what is shown in FIG. 3b. There is thus attained an operational point displacement adjusting to the signal level in question.

If a person or object in the detection area of the installation once again begins to move towards the apparatus from a stationary state, an operation impulse or condition will occur on the output line 28 of the comparison circuit, as previously mentioned. On the other hand, if the person turns and goes away from the detection area, the signal strength arriving at the receiver will decrease, resulting in that the balancing circuit 12 will obtain shorter states on its output, in turn signifying that the integrators 16 and 18 are adjusting themselves to the new conditions towards high level. The impulse integrator 16 adjusts itself most rapidly, signifying that high level will occur on the line 17 and consequently on the line 19 and input 21 of the comparison circuit 22. The output level of the following background integrator 18 will consequently be lower, signifying that a low level in relation to the input 21 will occur on the input 26 of the comparison circuit 22. No operation signal or state at all will then depart from the circuit and in the practical case the door will remain closed. Further to the apparatus being sensitive for movement, it is also sensitive to the direction of movement, which is of essential importance if a door opening function is to be controlled correctly.

The advantage with the integrator arrangement is that the amplifier 9 can always operate at full gain, i.e. there is always maximum sensitivity, even in situations where there are strong input signals to the photo-diodes 5. Due to its coupling to the balancing circuit 12 the background integrator 18 achieves that the device automatically adjusts itself to each new situation. The output signal from the background integrator will, as mentioned, control the working or threshold level of the balancing circuit 12 and thus adjust it when so required. The result of this will be that in most cases the device does not need to be specially adjusted, since it automatically adjusts itself to its environment, i.e. the presence of permanent stationary reflection surfaces.

This automatic adjustment also facilitates assembly and installation of the device, since no particular tuning measures are needed in this connection. The voltage divider 24 must, however, be set to a basic setting, so that an exact level for prevention of unintentional operation of a co-acting door opening mechanism is achieved. This later determines how close to the threshold level of the comparison circuit 22 the device shall be adjusted. The range of the device can be varied in this manner also.

Figure 4B:
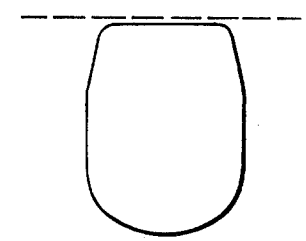

As pointed out in the introduction, the apparatus may be used as provider of signals to both sliding and leaf doors. The field picture (see FIG. 4) may be varied by changing the configuration of the mechanical screen 4 round the receiver diodes 5, shown in FIG. 1. The field picture according to FIG. 4a is suitable for use in conjunction with sliding doors, while the one according to FIG. 4b is suitable for leaf doors. Of course, in order to provide a special configuration of the detection area, the device may be implemented with lens systems for both LED's and photo-diodes.

Within the scope of invention it is naturally not necessary to form the circuit as described above. Forms of circuit other than integration circuits may be used, to provide two or more separate states, which can be applied to a comparison circuit for achieving triggering of operation on movement towards the intended detection device.

We claim:

1. In a device for detecting objects including a pulsed optical radiation source for transmitting light within the infra red range, and a receiver for receiving the radiation, which includes integration circuits having different integration times, means for comparing the outputs of the integration circuits, said means being adapted to deliver an operation signal as long as there is a difference in the outputs, the improvement wherein the integration circuits are connected in series, the integration circuit having the shorter integration time being connected to receive the signal level resulting from the received radiation.

2. Device as claimed in claim 1, wherein the receiver is adjustable to a threshold or working level with respect to received signals.

3. Device as claimed in claim 2, wherein the integration circuit with the longer integration time controls the threshold or working level for a balancing circuit for reception of incoming pulses, said balancing circuit being connected to send digital state levels on its output for each input signal applied to it, the duration of the state being related to the input signal conditions.

4. Device as claimed in claim 2, wherein the outputs of the integration circuits are each connected to an input of a comparison circuit via a voltage divider, the voltage divider connected to the output of the slower integration circuit being adjustable.

5. Device as claimed in claim 1, wherein the integration circuits are arranged to convert received digital states to direct current levels in relation to the width of the applied state, these direct current levels being applied to a comparison circuit as input levels.

6. Device as claimed in claim 1, wherein the radiation source controls light emitting diodes with pulses such that they emit infra red light, in that the receiver is positioned to receive reflected radiation, in that the light emitting diodes are connected to an amplifier feeding one input of a balancing circuit, in that the balancing circuit output is connected to a controllable blocking circuit, which is in turn connected to the input of the more rapid of said integration circuits, the output of which is connected to the integration circuit with the slower integration time as well as to a voltage divider, the output of which supplies voltage levels via a line to one input of a comparison circuit, in that the slower integration circuit is connected to an adjustable voltage divider, the output of which is connected via line to the comparison circuit, and in that the output of the slower integration circuit controls the second input of the balancing circuit, the output of the comparison circuit being connected to an output terminal.

* * * * *